(12) United States Patent
Maeder

(10) Patent No.: US 7,262,671 B2
(45) Date of Patent: Aug. 28, 2007

(54) AMPLITUDE LEVEL CONTROL CIRCUIT

(75) Inventor: Heinz Maeder, Weinfelden (CH)

(73) Assignee: Freescale Semiconductor, Inc., Austin, TX (US)

( * ) Notice: Subject to any disclaimer, the term of this patent is extended or adjusted under 35 U.S.C. 154(b) by 22 days.

(21) Appl. No.: 10/547,903

(22) PCT Filed: Feb. 24, 2004

(86) PCT No.: PCT/EP2004/050192

§ 371 (c)(1),
(2), (4) Date: Sep. 7, 2005

(87) PCT Pub. No.: WO2004/079894

PCT Pub. Date: Sep. 16, 2004

(65) Prior Publication Data

US 2006/0097812 A1    May 11, 2006

(30) Foreign Application Priority Data

Mar. 7, 2003    (GB) .................................. 0305229.7

(51) Int. Cl.
*H03B 5/00*    (2006.01)

(52) U.S. Cl. .................. 331/183; 331/182; 331/116 R; 331/116 FE; 331/175; 331/158

(58) Field of Classification Search ................ 331/158, 331/116 R, 116 FE, 175, 182, 183
See application file for complete search history.

(56) References Cited

U.S. PATENT DOCUMENTS

| | | | |
|---|---|---|---|
| 3,902,141 A | 8/1975 | Berney | |
| 4,360,789 A | 11/1982 | Lewyn et al. | |
| 4,405,906 A | 9/1983 | Luscher | |
| 5,825,255 A | 10/1998 | Dijkmans | |
| 7,030,709 B2 * | 4/2006 | Novac ........................ 331/158 |

FOREIGN PATENT DOCUMENTS

EP    1 289 121 A    3/2003

* cited by examiner

*Primary Examiner*—Arnold Kinkead

(57) ABSTRACT

Amplitude level control circuit for an oscillator comprising first means arranged to generate a first current for driving the oscillator; and second means arranged to generate a second current such that in direct current conditions the second current is arranged to be a predetermined ratio of the first current, wherein the second current is arranged to be added to a reference current to form a feedback current such that in direct current conditions the first current is determined by the reference current, the ratio of the feedback current and first current and the ratio of the first current and second current, wherein the second means is further arranged to reduce the second current as oscillations of the oscillator increase, thereby reducing the first current.

8 Claims, 1 Drawing Sheet

AMPLITUDE LEVEL CONTROL CIRCUIT

The present invention relates to an amplitude level control circuit for controlling the oscillation amplitudes of an oscillator.

Amplitude level control circuits are commonly used to control the oscillation amplitudes of crystal oscillators during crystal oscillations. However, to ensure proper start-up conditions for an oscillator are met many oscillator circuits are designed to initially use high gain.

The oscillation amplitude of an oscillation circuit is preferably limited by lowering the bias current amplitude to lowers its gain as the oscillator approaches the final oscillation, otherwise oscillation amplitude will increase until the oscillation level is limited by the large-signal nonlinearly of the driving amplifier. Loss mechanisms, which limit the amplitude in the absence of other means, tend to be such as to introduce frequency errors. Further, excessive oscillation amplitudes can cause excessive crystal drive levels to occur, which can result in long-term frequency drift.

One solution described in U.S. Pat. No. 6,194,973 uses an oscillation detector to control the oscillator current such that as the oscillation amplitudes increase the gain of the driving amplifier is reduced.

Although this solution allows an initial high gain to be generated at oscillation start-up and correspondingly to be reduce as the oscillation amplitudes increase this solution does not allow for the initial (i.e. start-up) current to be easily determined, as a result the initial current may be too high which could result in oscillations being inhibited.

It is desirable to improve this situation.

In accordance with a first aspect of the present invention there is provided an amplitude level control circuit for an oscillator comprising first means arranged to generate a first current for driving the oscillator; and second means arranged to generate a second current such that in direct current conditions the second current is arranged to be a predetermined ratio of the first current, wherein the second current is arranged to be added to a reference current to form a feedback current such that in direct current conditions the first current is determined by the reference current, the ratio of the feedback current and first current and the ratio of the first current and second current, wherein the second means is further arranged to reduce the second current as oscillations of the oscillator increase, thereby reducing the first current.

This provides the advantage of allowing the initial start-up current to be easily determined while also reducing power consumption by reducing the oscillator gain below the start-up gain once oscillation amplitudes have built up.

Preferably the first current is determined in the direct current condition by the product of the reference current and the ratio of the feedback current and the first current divided by one minus the product of the ratio of the feedback current and the first current and the ratio of the first current and second current.

Preferably the ratio of the feedback current and first current is a step-up ratio.

Preferably the ratio of the first current and second current is a step-down ratio.

Suitably the amplitude level control circuit further comprises means for generating the reference current.

An embodiment of the invention will how be described, by way of example, with reference to the drawings, of which:

Figure 1:
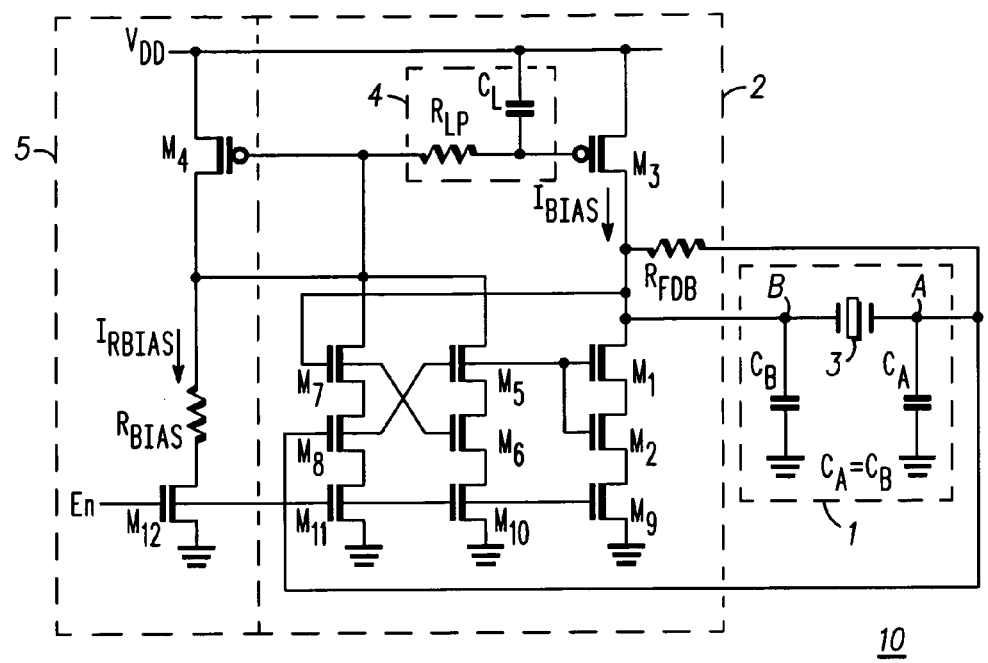
FIG. 1 shows a schematic circuit diagram of an amplitude level control circuit according to an embodiment of the present invention.

FIG. 1 illustrates an oscillator circuit 10 having a resonator 1, an amplitude level control circuit 2 for controlling the amplitude of the resonator 1 and a bias circuit 5.

The resonator 1, which in this embodiment is a Pierce-type two pin resonator, is formed by a crystal 3 embedded between two capacitors $C_A$, $C_B$. Each capacitor is connected at terminals remote from the crystal resonator to a voltage node $V_{SS}$.

Coupled to the input A and output B of the resonator 1 is the amplitude level control circuit 2 that is arranged to generate a well defined current to drive the resonator 1 at start-up with sufficient gain to initiate oscillation in a well controlled manner. However, once the resonator 1 begins to oscillate the amplitude level control circuit is arranged to decrease amplifier gain to a level that maintains the dissipation, crystal fatigue or other problems associated with over driving an oscillator.

The amplitude level control circuit 2 is coupled to the bias circuit 5, as described below. The bias circuit 5 includes a PMOS transistor M4 that has its drain coupled to a voltage source $V_{DD}$ and is placed in a diode configuration (i.e. its source is coupled to its gate). Additionally, the source of PMOS transistor M4 is coupled to a bias resistor $R_{BIAS}$, where the bias resistor $R_{BIAS}$ is coupled to the voltage source $V_{SS}$ via enable switch NMOS transistor M12.

Coupled to the gate of PMOS transistor M4 is the gate of another PMOS transistor M3 in a mirror configuration via a low pass filter 4. The low pass filter 4 includes a resistor $R_{LP}$ in series between the gates of PMOS transistors M4 and M3 and a capacitor $C_{LP}$ that has one terminal coupled between the gates of the PMOS transistors M4 and M3 and another terminal coupled to voltage source $V_{DD}$.

The low-pass filter 4 introduces a dominant pole frequency in the amplitude level control circuit feedback loop, as described below, to prevent low-frequency parasitic oscillation of the feedback loop.

The PMOS transistors M4 and M3 are configured to operate as a first current mirror where the current mirror has a step-up ratio of, for example, 8.

The source of the PMOS transistor M3 is coupled to power supply $V_{DD}$ and the drain of PMOS transistor M3 is coupled to the drain of a NMOS transistor M1.

The drain of NMOS transistor M1 is also connected to the output B of the M2 is coupled to the drain of a switch NMOS transistor M9 that has its gate coupled to an enable signal. The source of the switch NMOS transistor M9 is coupled to $V_{SS}$.

The PMOS transistor M3 and NMOS transistors M1 and M2 act as the amplifier for the Pierce resonator 1. The amplifier that is formed by PMOS transistor M3 and NMOS transistors M1 and M2 is held in its active or transition region by a feedback resistor $R_{FDB}$ that is coupled between the gate of NMOS transistors M1 and M2 and the source of NMOS transistor M1.

The amplifier can be activated or deactivated via the enable switch NMOS transistor M9.

Coupled to the input and output of the Pierce resonator 1 are two series stacked NMOS transistors M5, M6, M7, M8 that have cross coupled gates such that the gates of NMOS transistors M7 and M6 are coupled to the resonator 1 output B and the gates of NMOS transistors M8 and M5 are coupled to the resonator 1 input A. Further, the drain of the NMOS transistors M7 and M5 are coupled to the gate of the PMOS transistor M4. The source of NMOS transistor M7 is coupled to the drain of NMOS transistor M8 with the source of NMOS transistor M8 coupled to voltage source $V_{SS}$ via enable switch NMOS transistor M11. The source of NMOS transistor M5 is coupled to the drain of NMOS transistor M6 and the source of NMOS transistor M6 is coupled to voltage source $V_{SS}$ via enable switch NMOS transistor M10.

The two series stacked NMOS transistors M5, M6, M7, M8 are arranged to form a second current mirror with the NMOS transistors M1 and M2. The second current mirror is arranged to have a current step-down ration, for example 1/10.

For the purposes of the invention the two series stacked NMOS transistors M5, M8, M7, M8 could be replaced with a single stack, however the use of a two series stacked transistors ensures a decrease in feedback current when oscillation amplitudes increase even in the case of a difference in amplitude at the resonator 1 input A and output B that may result, for example due to a difference between the capacitors $C_A$ and $C_B$.

The oscillator circuit 10 is activated by enabling of the enable switch transistors M12, M11, M10 which result in a reference current $I_{RBIAS}$ being generated by resistor $R_{BIAS}$ that flows from $V_{DD}$ through the diode configured PMOS transistor M4, the resistor $R_{BIAS}$, and the enable switch transistor M12 to $V_{SS}$.

Additionally, once the oscillator circuit 10 has been enabled the feedback resistor $R_{FCB}$ ensures that the mean gate voltage of NMOS transistors M1 and M2 are set to their mean drain voltage, thereby ensuring that they act as diode-connected MOS devices. Accordingly, the current mirror arrangement formed by PMOS transistors M4 and M3 results in an associated bias current forming in the oscillator amplifier (i.e. PMOS transistor M3 and NMOS transistors M1 and M2). The amplifier current $I_{BIAS}$ is dependent upon the step-up ratio of the first current mirror. This ensures that the amplifier remains at the intended operating point. Thus in the absence of the oscillation as found at the oscillator start-up the devices M1 and M2 behave as a diode-connected MOS device and control the current flow in the corresponding NMOS device stacks M7 and M8; M5 and M6 respectively where the current flow through the series stacked NMOS transistors is determined by the step-down ration of the second current mirror.

As the output of the series stacked transistors is coupled to the gate of PMOS transistor M4, the series stacked transistor output current is added to the mirror with PMOS transistor M4. This results in the two series stacked NMOS transistors M5, M6, M7, M8 forming a positive feedback loop between the bias circuit 5 formed by PMOS transistor M4 and bias resistance $R_{BIAS}$ and oscillator amplifier formed by PMOS transistor M3 and NMOS transistors M1 and M2.

As a result, the oscillator bias current $I_{BIAS}$ provided by PMOS transistor M3 at start-up is determined by the reference current $I_{RBIAS}$ and the current ratios of the two current mirrors by the equation:

$$I(BIASini) = (I(RBIAS) \times \text{first current mirror ratio}) / (1 - \text{first current mirror ration} \times \text{second current mirror})$$

This equation is derivable as a consequence of the devices M1, M2, M3, M4, M5, M6, M7, M8 all operated in the saturated region while the enable devices $M_9$-$M_{11}$ operated in the linear region. Additionally identical channel lengths are chosen for devices $M_1$, $M_2$, $M_5$, $M_6$, $M_7$, and $M_8$ and the three enable devices $M_9$-$M_{11}$. In the absence of oscillation the current flow in the NMOS device stacks is:

$$I_{M5} = I_{M7} = I_{M2} * R_2 I_{M7} = I_{M3} * R_2 \tag{1}$$

where R1 is set by the ratio of the related device widths:

$$R_2 = w_{M5}/w_{M1} = w_{M7}/w_{M1} = w_{M10}/w_{M9} = w_{M11}/w_{M9}$$

Note: $w_{M1} = w_{M2}$; $w_{M5} = w_{M6}$; $w_{M7} = w_{M8}$

Similarly the PMOS devices $M_3$ and $M_4$ are of equal length such that the current flow in device $M_3$ relative to the current flow in device $M_4$ is:

$$I_{M3} = I_{M4} \cdot R_1 \tag{2}$$

Where $R_1 = w_{M3}/w_{M4}$

In the absence of oscillation the DC bias current $I_{BIAS}$ flowing In devices $M_1$, $M_2$, $M3$, and $M9$ can be determined in a few steps to:

$$I_{M4} I_{RBIAS} + I_{M7} I_{M5} \tag{3}$$

Substituting $I_{M7}$ and $I_{M5}$ with (1) gives:

$$I_{M4} = I_{RBIAS} + I_{M3} * 2 * R_2 \tag{4}$$

Substituting $+I_{M4}$ with (2) gives:

$$I_{M3}/R_1 = I_{RBIAS} + I_{M3} * 2 * R_2 \tag{5}$$

which can be resolved to:

$$I_{M3} = I_{BIAS} = I_{RBIAS} * R_1/(1 - 2 * R_1 * R_2) \tag{6}$$

Therefore, by way of example, if the bias resistor $R_{BIAS}$ is chosen to generate a DC bias current $I_{BIAS}$ of 37.6 μA and the first current mirror is arranged to have a step-up ratio of 8 and the second current mirror is arranged to have a step-down ratio of 1/10 the amplifier bias start-up current will be:

$$37.6 \mu A \times 8/(1 - 8/10) = 1.5 \text{ mA}$$

As the gates of the two series stacked NOMOS transistors M5, M6, M7, M8 are coupled to the input A and output B of the Pierce resonator 1 as oscillation amplitudes of the resonator 1 increases the positive and negative halves of the oscillating signal interact with the two series stacked NMOS transistors M5, M6, M7, M8 to reduce the output current as during each half wave the transistor gates controlled by the opposite phase signal will turn off the series stack except when they are in the transition region near the zero crossing such that the oscillator bias current $I_{BIAS}$ can be reduced, by way of example, down to ⅕ of the start up current unless the final oscillation amplitude has been established for a higher bias current. This is a consequence of the duration of the transition region near zero crossing becoming shorter towards higher oscillation amplitudes when current flows in stacked feedback devices M5, M6 and M7, M8.

If the feedback current becomes negligibly small then the effective current ratio $R_2$ approaches zero; hence the remaining bias current can be determined from:

$$I_{BIAS\_min} = I_{RBIAS} * R_1 \tag{7}$$

which amounts by way of example to 37.6 μA×8=301 uA

Since the power supply voltage $V_{DD}$ only needs to be larger than Vth+2*$V_{dsat}$ this has the further advantage of allowing the amplitude level control level circuit 2 to be suitable for low power supply voltages of approximately 1.0 to 1.5V.

To determine the minimum operating voltage there are two different current branches to consider:
1) M3, M1, M2, and M9:
2a) M4, M5, M6, and M10; as well as the equivalent stack
2b) M4, M7, M8, and M11.

The series stacked devices M1 and M2 can be regarded as a single device Mi. Its DC operating conditions are $$V_{GS\_M3}=V_{DS\_M3}=V_{th\_N}+V_{dsat\_M1}$$

Device M3 is operated in saturation which requires that its drain to source voltage must be larger than its saturation voltage; $V_{ds\_M3} > V_{dsat\_M3}$. The above conditions are fulfilled if:

Similarly one can note for device M4:

$$V_{GS\_M4}=V_{DS\_M4}=V_{th\_P}+V_{dsat\_M4}$$

The series stacked devices M5 and M6 can be regarded as a single device Mf which is operated in saturation; hence $V_{ds\_Mf} < V_{dsat\_Mf}$. The above conditions are fulfilled if:

$$VDD \geq V_{th\_P}+|V_{dsat\_M4}|+V_{dsat\_Mf}$$

By way of example the threshold voltages are $V_{th} = V_{th\_N} \sim = -V_{th\_P} \sim = 0.6V$ and th saturation voltages $V_{dsat\_N} \sim = -V_{dsap\_P} \sim = 0.25V$. Hence the minimum supply voltage is:

$$VDD_{min} = V_{th}+2*V_{dsat}=0.6V+2*0.25V=1.1V$$

In the above calculation the voltage drop across the enabling devices M9, M10, and M11 has been ignored. These devices are operated in the linear region at low drain to source voltage of $V_{ds} < 0.05V$ and increase the minimum power supply voltage by an insignificant small amount.

Figure 2:
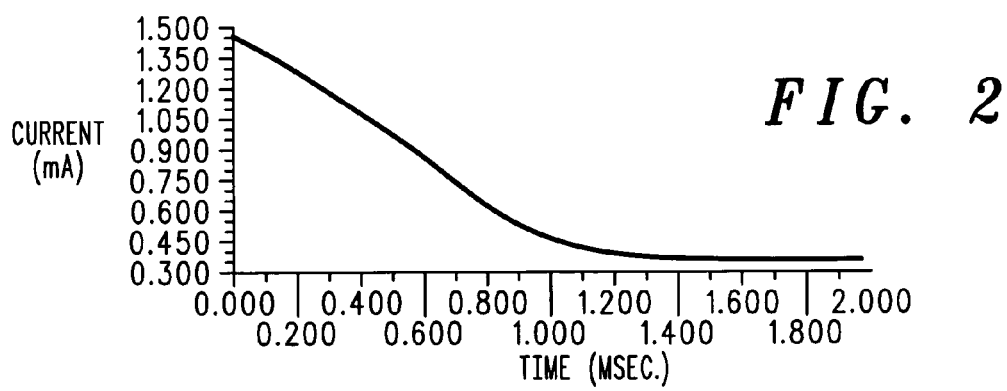
FIGS. 2 and 3 illustrate waveforms that occur at power-up of an oscillator using an amplitude level control circuit according to an embodiment of the present invention.

FIG. 2 shows a typical amplifier bias current $I_{BIAS}$ verse time graph where the amplitude level control circuit has been configured to provide a start up current of 1.36 mA and arranged to decrease as the oscillator amplitudes increase, which in this example, the bias current levels off at 0.35 mA.

Figure 3:
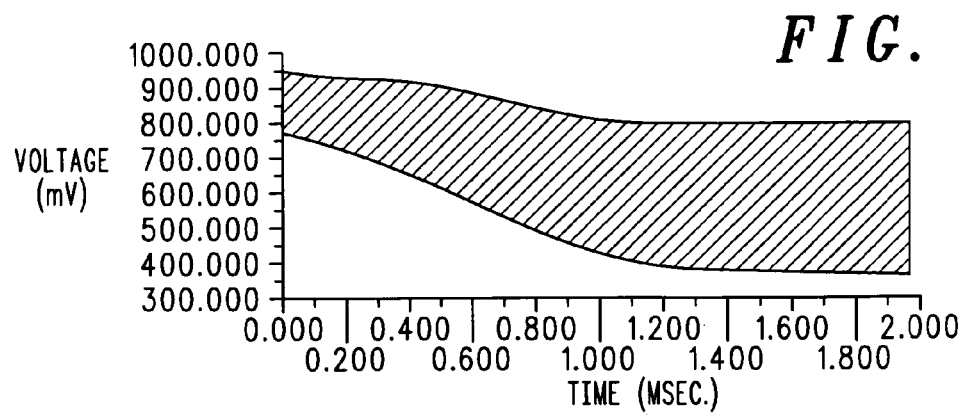

FIG. 3 shows the waveform at node B of the oscillator and shows the increase of the oscillation amplitude as function of time. It further can be noted that its mean value is reduced over time which is caused by the decreasing bias current.

The invention claimed is:

1. Amplitude level control circuit for an oscillator comprising:

first means arranged to generate a first current for driving the oscillator; and a stacked transistor arrangement for generating a second current such that in direct current conditions the second current is arranged to be a predetermined ratio of the first current, the stacked transistor arrangement comprising cross-coupled transistors; wherein the second current is arranged to be added to a reference current to form a feedback current such that in direct current conditions the first current is determined by the reference current, the ratio of the feedback current and first current and the ratio of the first current and second current, wherein the stacked transistor arrangement is further arranged to reduce the second current as oscillations of the oscillator increase, thereby reducing the first current.

2. Amplitude level control circuit according to claim 1, wherein the first current is determined in the direct current condition by the product of the reference current and the ratio of the feedback and first current divided by one minus the product of the ratio of the feedback current and first current and second current.

3. Amplitude level control circuit according to claim 1, wherein the ratio of the feedback current and first current is a step-up ratio.

4. Amplitude level control circuit according to claim 1, wherein the ratio of the first and second current is a step-down ratio.

5. Amplitude level control circuit according to claim 1, wherein the stacked transistor arrangement includes two series stacked devices that have cross coupled gates.

6. Amplitude level control circuit according to claim 1, further comprising means for generating the reference current.

7. Amplitude level control circuit according to claim 1, wherein the oscillator includes a Pierce crystal oscillator.

8. Oscillation circuit comprising an amplitude level control circuit according to claim 1 and an oscillator.

* * * * *